(12) United States Patent
Jung

(10) Patent No.: US 7,727,812 B2
(45) Date of Patent: Jun. 1, 2010

(54) SINGULATION METHOD OF SEMICONDUCTOR DEVICE

(75) Inventor: Meng An Jung, Ichceon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 5 days.

(21) Appl. No.: 11/959,775

(22) Filed: Dec. 19, 2007

(65) Prior Publication Data
US 2008/0153263 A1 Jun. 26, 2008

(30) Foreign Application Priority Data
Dec. 22, 2006 (KR) .................. 10-2006-0132688

(51) Int. Cl.
*H01L 21/00* (2006.01)
(52) U.S. Cl. ............... 438/113; 438/906; 257/E21.599; 257/E21.606
(58) Field of Classification Search ............ 438/113, 438/906, 705; 257/E21.532, E21.533, E21.599, 257/E21.602, E21.603, E21.607, E21.028, 257/E21.606
See application file for complete search history.

(56) References Cited

U.S. PATENT DOCUMENTS

| | | | | |
|---|---|---|---|---|
| 4,604,411 A | * | 8/1986 | Yada et al. ............... | 522/14 |
| 4,606,993 A | * | 8/1986 | Fujikawa et al. ......... | 430/281.1 |
| 5,896,001 A | * | 4/1999 | Shishido .................... | 313/461 |
| 2002/0063115 A1 | * | 5/2002 | Kim et al. ............. | 219/121.67 |
| 2003/0162313 A1 | * | 8/2003 | Kim et al. .................... | 438/33 |
| 2007/0066032 A1 | * | 3/2007 | Lu et al. .................... | 438/462 |
| 2007/0218652 A1 | * | 9/2007 | Li et al. .................... | 438/463 |
| 2008/0132037 A1 | * | 6/2008 | Furui ........................ | 438/465 |

FOREIGN PATENT DOCUMENTS

| | | |
|---|---|---|
| JP | 2005-203679 | 7/2005 |
| KR | 1999-000220 | 1/1999 |
| KR | 2003-0078374 | 10/2003 |

* cited by examiner

*Primary Examiner*—Caridad M Everhart
(74) *Attorney, Agent, or Firm*—Finnegan, Henderson, Farabow, Garrett, & Dunner, L.L.P.

(57) ABSTRACT

Provided is a singulation method of a semiconductor device that can perform a sawing process while protecting a pad. In the singulation method for forming a semiconductor device including a scribe lane region and a chip region, pads are formed in the chip region. Photoresist patterns exposing the scribe lane region and covering the pads are formed, and a substrate in the scribe lane region is cut and a washing solution is sprayed on the scribe lane region. According to the method, wafers can be stably separated from each other while pads of a semiconductor device are protected, so that stabilization in the fabrication process can be realized and pad corrosion caused by DI water is prevented during a sawing process. Accordingly, a defective device is minimized and reliability of a device can improve.

12 Claims, 4 Drawing Sheets

SINGULATION METHOD OF SEMICONDUCTOR DEVICE

RELATED APPLICATION

This application is based upon and claims the benefit of priority to Korean Patent Application No. 10-2006-0132688 filed on Dec. 22, 2006, the entire contents of which are incorporated herein by reference.

BACKGROUND

The present disclosure relates to manufacturing of a semiconductor device, and more particularly, to a singulation method of a semiconductor device that allows a sawing process to be performed while protecting a pad.

Generally, a manufacturing process of a semiconductor device can be divided into a fabrication (FAB) process and a packaging process.

The FAB process is a process for forming fine patterns in a silicon wafer to form circuits, and the packaging process is a process for processing the wafer in which the fine patterns have been formed to allow electricity to be supplied to individual chips of the wafer.

Here, the packaging process is a technology for separating only normal chips (or dies) as individual chips and forming them in packages. This is done so that they have electrical and physical characteristics to protect the chips from external, mechanical, physical, and chemical impacts, and allows them to be mounted in a printed circuit board (PCB).

A metal pad opening and bonding process of a semiconductor device will be described below with reference to the accompanying drawings.

FIG. 1 is a cross-sectional view illustrating a sawing process of a semiconductor device according to a related art, and FIG. 2 is a plan view illustrating a pad portion in the case where a sawing process of a semiconductor device according to a related art is applied.

Referring to FIGS. 1 and 2, a packaging process includes: a wafer-mount operation of classifying chips into normal chips and defective chips at a wafer level when FAB-out is completed; a sawing operation of singulating chips from a wafer with reference to a scribe lane; a bonding operation of bonding a singulated chip to a lead frame using epoxy, which is a conductive adhesive, and connecting gold wires of high purity as capillaries, for electrical connection between metal pads of the chip and leads of the lead frame; molding an outer portion of the chip using a thermoset resin to protect a wire bonding-completed chip from an outside physical impact or a chemical change.

The metal pad pattern is opened using a photolithography process before the sawing process.

After that, fine patterns (not shown) forming a chip circuit are formed on a semiconductor substrate 100 using a thin film forming process, a diffusion process, a photolithography process, and an etching process.

Metal pads 103 are formed on an interlayer insulating layer in pad forming regions of a first wafer A and a second wafer B including the fine patterns.

The metal pads can be formed of aluminum (Al).

Also, a passivation layer 101 is formed using a nitride layer or an oxide layer to protect devices and circuits formed of various metals formed on the semiconductor substrate 100 from outside contaminating sources, and to prevent corrosion.

To open the metal pad 103 for connection with an outside power source, a photoresist is coated on an entire surface and selectively exposed and developed to form a photoresist pattern including a pad open region.

An exposed passivation layer 101 is selectively etched through an etching process using plasma using the photoresist pattern as a mask to open the metal pad 103.

A sawing process is performed on the above-manufactured semiconductor substrate.

A first wafer A and a second wafer B are separated from each other through the sawing process.

In detail, the wafer is cut along a scribe lane using a sawing wheel 125 to separate semiconductor devices existing in the circular silicon wafer.

At this point, deionized water 113 is sprayed using a spraying nozzle 123 simultaneously with the cutting to remove silicon powder 111 generated when the wafer is cut during the sawing process.

The above-described metal pad forming process and sawing process of the semiconductor device according to the related art have the following limitations.

While the metal pad 103 is exposed to the outside through a hole 130 of the passivation layer 101 and the sawing process is performed, corrosion is generated at the metal pad 103 due to deionized (DI) water used for removing byproducts 150 such as silicon powder 111.

Also, according to the related art, the metal pad 103 of the semiconductor device is contaminated by the silicon powder 111 generated during the sawing process.

These limitations generate defective semiconductor device leading to reduced yield.

BRIEF SUMMARY

Embodiments provide a singulation method of a semiconductor device applying a sawing process, that can stably separate chips from a wafer while protecting pad portions of the semiconductor device.

In one embodiment, a method for forming a semiconductor device including a scribe lane region and a chip region includes: forming pads in the chip region; forming photoresist patterns exposing the scribe lane region and covering the pads; and cutting a substrate in the scribe lane region and spraying washing solution on the scribe lane region.

In another embodiment, a method for forming a semiconductor device including a scribe lane region and a chip region, includes: forming pads in the chip region; forming a photoresist pattern exposing the scribe lane region and covering the pads; cutting a substrate in the scribe lane region and spraying deionized water to the scribe lane region; and spraying at least one of thinner and acetone on the scribe lane region to remove the photoresist pattern.

The details of one or more embodiments are set forth in the accompanying drawings and in the description below. Other features will be apparent from the description and drawings, and from the claims.

DETAILED DESCRIPTION

Reference will now be made in detail to the embodiments of the present disclosure, examples of which are illustrated in the accompanying drawings.

FIGS. 3A to 3G are sectional views illustrating a manufacturing process of a semiconductor device according to the present disclosure.

A first wafer A and a second wafer B include a scribe lane region C and a semiconductor chip region in which a semiconductor chip is formed.

First wafer A and second wafer B are separated into individual wafers by a sawing process after a semiconductor device forming process.

A plurality of semiconductor devices such as transistors, wiring structures between the transistors, and interlayer insulating layers for insulating between devices are formed in each semiconductor chip region of first wafer A and second wafer B.

Figure 1:
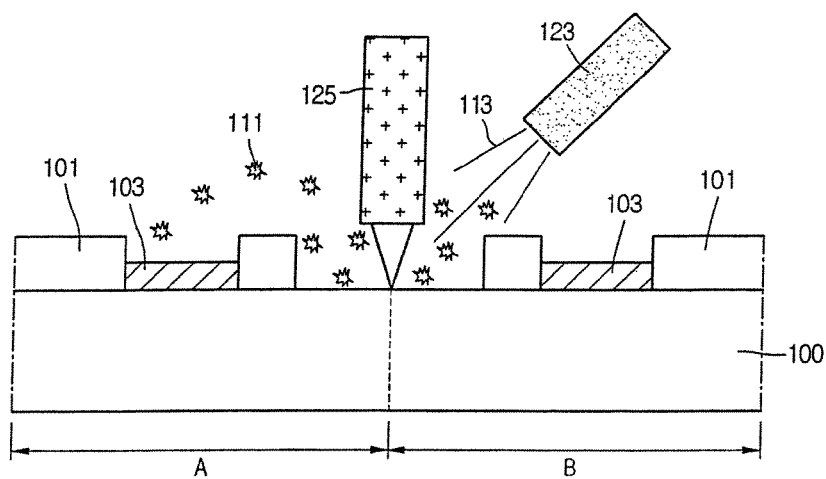
FIG. 1 is a cross-sectional view illustrating a sawing process of a semiconductor device according to a related art.
Figure 2:
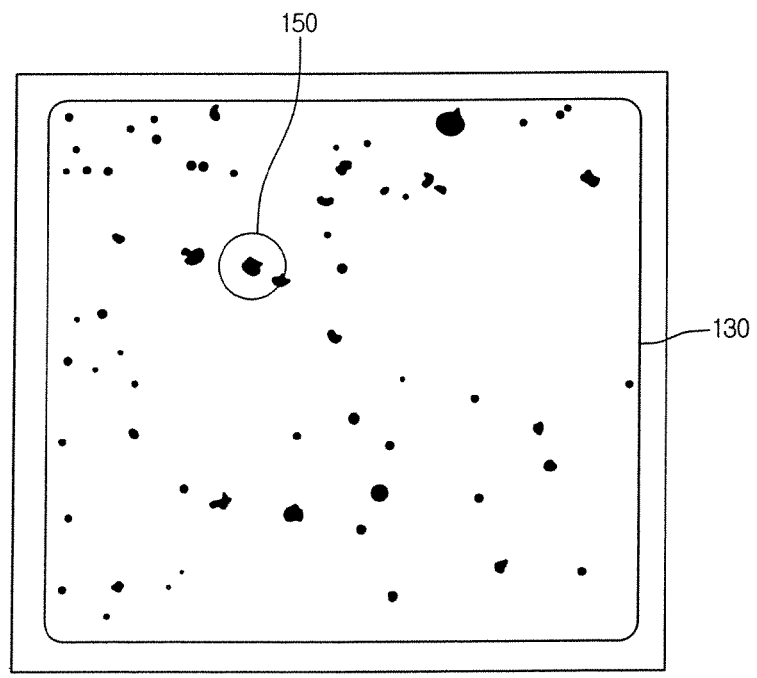
FIG. 2 is a plan view illustrating a pad portion in the case where a sawing process of a semiconductor device according to a related art is applied.
Figure 3A:
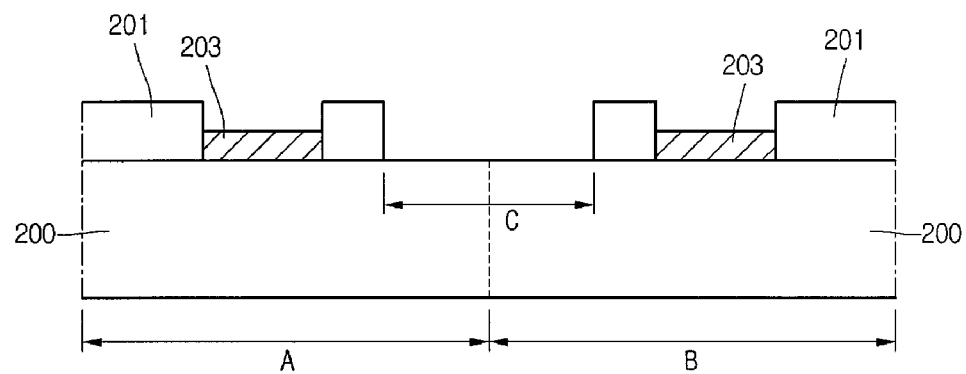
FIGS. 3A to 3G are sectional views illustrating a manufacturing process of a semiconductor device according to the present disclosure.

Referring to FIG. 3A, a metal pad 203 is formed on a semiconductor substrate 200 of first wafer A and second wafer B.

For example, the metal pad 203 can be an aluminum pad.

The Scribe lane region C can be in the range of 100-200 µm.

A passivation layer 201 is formed on the semiconductor layer 200 including the metal pad 203, and the metal pad 203 is exposed using a mask for a pre-pad open.

Figure 3B:
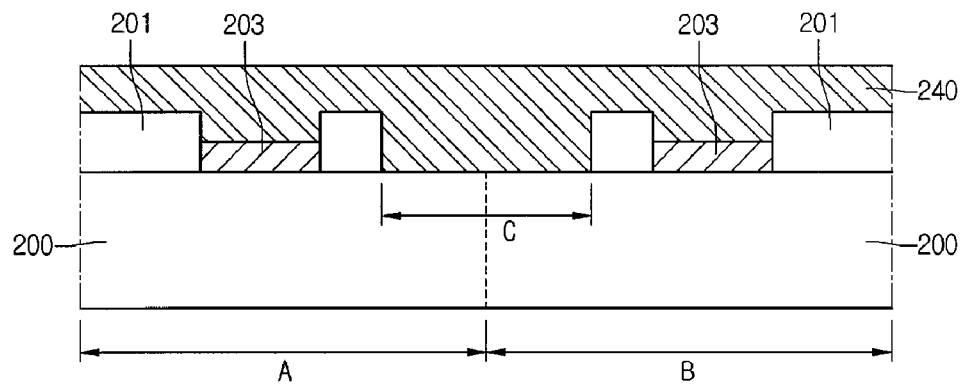

Referring to FIG. 3B, a photoresist layer 240 covering the scribe lane region C and the semiconductor chip region is formed on entire surfaces of first wafer A and second wafer B.

The photoresist layer 240 can be formed of a positive photoresist material or a negative photoresist material.

The positive photoresist material is a material where a cross link is destroyed at a light receiving portion and the light receiving portion is removed by a developing solution. The negative photoresist material is a material where a cross link is created at a light receiving portion and a non-light receiving portion is removed by a developing solution.

Here, the photoresist layer 240 can be a positive photoresist layer.

The photoresist layer 240 has a thickness of 3 to 5 µm.

Figure 3C:
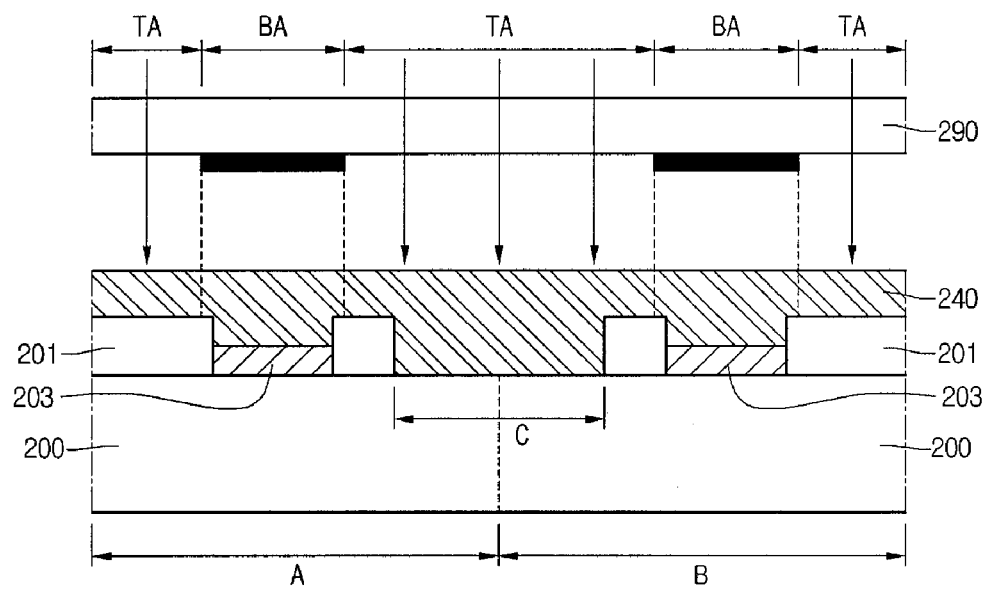

Referring to FIG. 3C, a photomask 290 is disposed with a predetermined interval above the photoresist layer 240, and light, for example, an ultraviolet ray is illuminated onto the photomask 290.

The photomask 290 has patterns to transmit or block illuminated light and control an amount of light. The photomask 290 includes a light blocking portion BA and a light transmission portion TA.

The light blocking portion BA of the photomask 290 is formed of a material that can block light illuminated onto the photomask 290. The light transmission portion TA of the photomask 290 is formed of a transparent material that can transmit all of light illuminated onto the photomask 290 or is formed to open.

Here, the light blocking portion BA of the photomask 290 corresponds to a portion including the metal pad 203. The light transmission portion TA of the photomask 290 corresponds to a portion including the scribe lane region C.

The photomask 290 is disposed on entire surfaces of first wafer A and second wafer B. Also, light that has passed through the photomask 290 is delivered onto the photoresist layer 240.

Figure 3D:
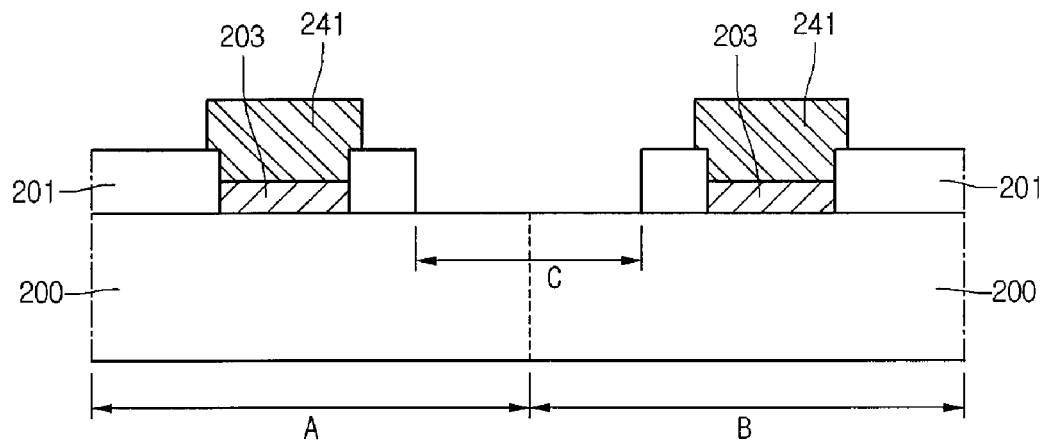

Referring to FIG. 3D, when the photoresist layer 240 is developed by dipping the photoresist layer 240 in a developing solution or spraying a developing solution onto photoresist layer 240, photoresist patterns 241 are formed.

A portion of the photoresist patterns 241 that corresponds to the light blocking portion BA is not developed and remains, and a portion of the photoresist patterns 241 that corresponds to the light transmission portion TA is removed by a developing solution to expose the region C where scribing is performed.

Figure 3E:
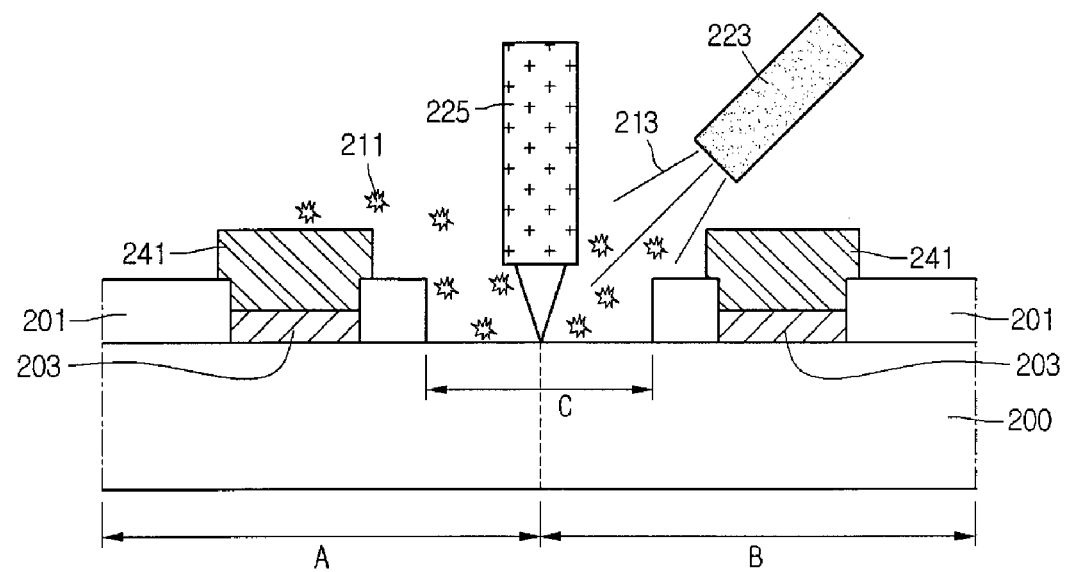
Figure 3F:
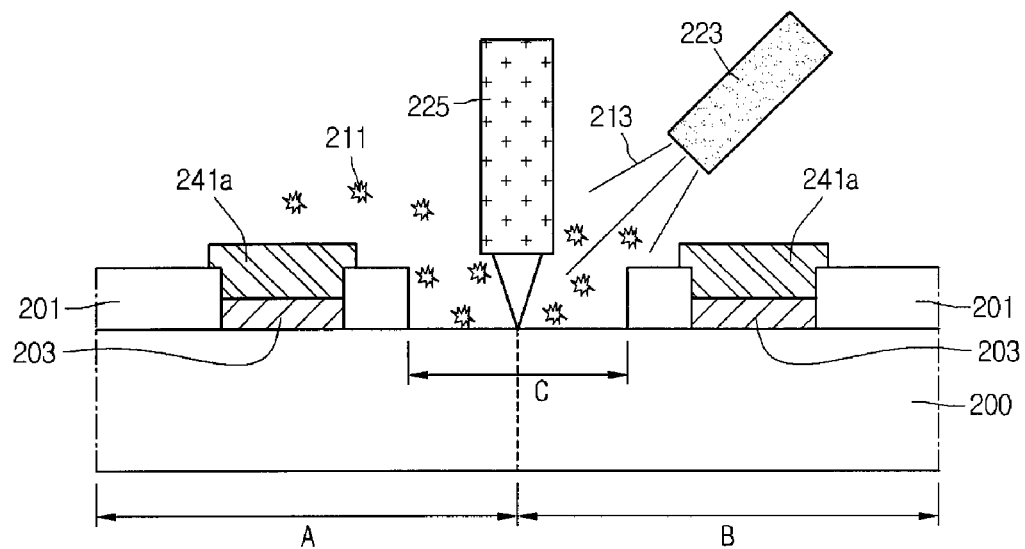

Referring to FIGS. 3E to 3F, a sawing process is performed in the scribe lane region C using a sawing wheel 225.

First wafer A and second wafer B are separated into individual wafers by the sawing process.

Washing solution 213 is sprayed onto the scribe lane region C from a spraying nozzle 223 simultaneously with the sawing process to prevent a byproduct, for example, silicon powder 211 generated during the sawing process from contaminating the metal pad 203.

Washing solution 213 can be sprayed onto an entire surface of the wafers, and concentrated on the scribe lane region C.

The washing solution 213 can be a thinner solution to simultaneously remove the photoresist patterns remaining on the metal pad 203.

The washing solution 213 can include acetone that can remove the positive photoresist patterns.

Therefore, the washing solution 213 can wash byproducts of the sawing process and simultaneously remove the photoresist patterns 241.

FIGS. 3E to 3F illustrate that the thicknesses of the photoresist patterns 241 and 241a gradually decreases as the sawing process is performed.

The photoresist pattern 241a may cover the metal pad 203 and does not expose the metal pad 203 until the sawing process is completed.

Therefore, the metal pad 203 formed of aluminum is not exposed, not contaminated by the byproducts, and there is no possibility that the metal pad 203 is corroded, so that process stability can improve and reliability of a device can improve.

Figure 3G:
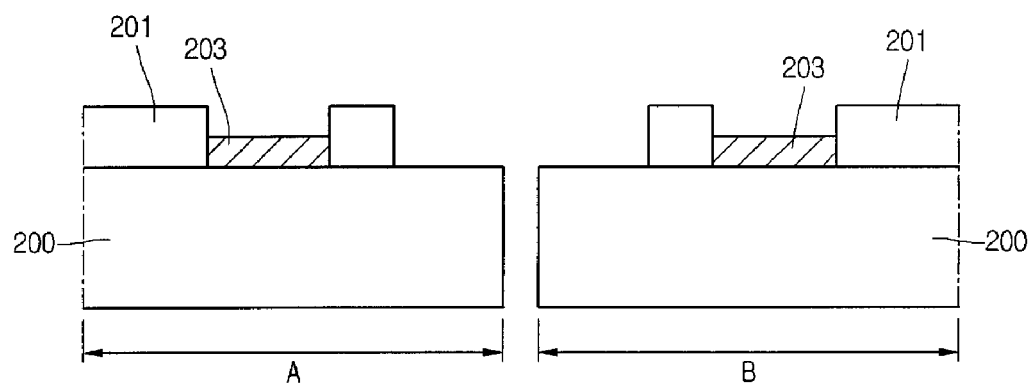

First wafer A and second wafer B are stably separated from each other by the above-described process as illustrated in FIG. 3G.

That is, according to an embodiment, a wafer can be stably separated while a pad of a semiconductor device is protected, so that stability in the FAB process can be realized.

According to an embodiment, pad contamination caused by byproducts is prevented during the sawing process of the semiconductor device, so that contact defects in the pad can be prevented.

According to an embodiment, corrosion of a pad caused by DI water is prevented during the sawing process of the semiconductor device, so that a defective device can be minimized.

According to an embodiment, photoresist patterns are removed while silicon powder, which is a byproduct, is removed using a thinner or acetone as washing solution during the sawing process of the wafer, and pad corrosion is prevented.

Also, according to another embodiment, silicon powder, which is a byproduct, is removed and washed using DI water as washing solution during a sawing process of a wafer. After that, photoresist patterns covering a pad is removed, and a thinner or acetone can be sprayed to prevent pad corrosion.

According to an embodiment, since wafers can be stably separated from each other while the pad of a semiconductor device is protected, stability in the FAB process can be realized.

According to an embodiment, pad corrosion caused by a byproduct is prevented during a sawing process of a semiconductor device to prevent contact defect in the pad.

According to an embodiment, pad corrosion caused by DI water is prevented during a sawing process of a semiconductor device to minimize a defective device.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for forming a semiconductor device including a substrate, a scribe lane region, and a chip region, the method comprising:
   forming pads in the chip region;
   forming photoresist patterns exposing the scribe lane region and covering the pads;
   sawing the substrate in the scribe lane region; and
   spraying washing solution on the substrate simultaneously with sawing the substrate, wherein spraying the washing solution on the substrate comprises reducing a thickness of the photoresist patterns.

2. The method according to claim 1, wherein the washing solution is at least one of a thinner or acetone.

3. The method according to claim 1, wherein the pads are aluminum pads.

4. The method according to claim 1, wherein the photoresist patterns are stacked having a thickness of 3-5 μm.

5. The method according to claim 1, wherein forming of the photoresist patterns comprises:
   forming a photoresist layer covering the scribe lane region and the chip region;
   disposing a mask having an opening and a transmission portion on the photoresist layer;
   illuminating light onto the mask to selectively cure the photoresist layer; and
   developing the photoresist layer.

6. The method according to claim 5, wherein forming the photoresist layer comprises forming a positive photoresist layer.

7. A method for forming a semiconductor device including a substrate, a scribe lane region, and a chip region, the method comprising:
   forming pads in the chip region;
   forming a photoresist pattern exposing the scribe lane region and covering the pads;
   sawing the substrate in the scribe lane region; and
   spraying deionized water on the scribe lane region simultaneously with sawing the substrate.

8. The method according to claim 7, wherein the pads are aluminum pads.

9. The method according to claim 7, wherein the photoresist patterns are stacked having a thickness of 3-5 μm.

10. The method according to claim 7, further comprising spraying at least one of a thinner or acetone onto the scribe lane region to remove the photoresist patterns.

11. The method according to claim 7, wherein the forming of the photoresist pattern comprises:
   forming a photoresist layer covering the scribe lane region and the chip region;
   disposing a mask having an opening and a transmission portion on the photoresist layer;
   illuminating light onto the mask to selectively cure the photoresist layer; and
   developing the photoresist layer.

12. The method according to claim 11, wherein the photoresist layer is a positive photoresist layer.

* * * * *